(12) United States Patent
Shi et al.

(10) Patent No.: US 12,062,898 B2
(45) Date of Patent: Aug. 13, 2024

(54) METHOD FOR MANUFACTURING A BUSBAR AND SUCH A BUSBAR

(71) Applicant: Rogers BV, Evergem (BE)

(72) Inventors: Wei Shi, Suzhou (CN); Liang Tang, Suzhou (CN)

(73) Assignee: ROGERS BV, Evergem (BE)

( * ) Notice: Subject to any disclaimer, the term of this patent is extended or adjusted under 35 U.S.C. 154(b) by 630 days.

(21) Appl. No.: 17/293,750

(22) PCT Filed: Apr. 29, 2019

(86) PCT No.: PCT/EP2019/060851
§ 371 (c)(1),
(2) Date: May 13, 2021

(87) PCT Pub. No.: WO2020/098979
PCT Pub. Date: May 22, 2020

(65) Prior Publication Data
US 2022/0029403 A1    Jan. 27, 2022

(30) Foreign Application Priority Data
Nov. 14, 2018 (EP) .................................. 18 206 250

(51) Int. Cl.
*H02G 5/00* (2006.01)
*B23K 26/21* (2014.01)
(Continued)

(52) U.S. Cl.
CPC ............. *H02G 5/005* (2013.01); *B23K 26/21* (2015.10); *H01G 2/02* (2013.01); *H01G 4/40* (2013.01); *H01G 13/00* (2013.01)

(58) Field of Classification Search
CPC .......... H02G 5/005; B23K 26/21; H01G 2/02; H01G 4/40; H01G 13/00; H05K 7/14329
See application file for complete search history.

(56) References Cited

U.S. PATENT DOCUMENTS 5,579,217 A * 11/1996 Deam ..................... H01L 23/52
                                                                257/E23.141
2001/0030126 A1* 10/2001 Romine ................... C25B 9/65
                                                                        204/252
(Continued)

FOREIGN PATENT DOCUMENTS

CN          202474475 U      10/2012
CN          203504394 U       3/2014
(Continued)

OTHER PUBLICATIONS

International Preliminary Report on Patentability for International Application No. PCT/EP2019/060851, International Filing Date Apr. 29, 2019, Date of Mailing Sep. 28, 2020, 7 pages.
(Continued)

*Primary Examiner* — Jeffrey T Carley
*Assistant Examiner* — Jose K Abraham
(74) *Attorney, Agent, or Firm* — CANTOR COLBURN LLP

(57) ABSTRACT

A method for manufacturing a busbar (1), in particular a laminated busbar (1), configured for mounting an electronic component, in particular a passive electronic component such as a capacitor, on the busbar (1), comprising:
providing a first conductive layer (11) made from aluminum,
providing a first connector element (15) for connecting the first conductive layer (11) and the electronic component, wherein the first connector element (15) is at least partially covered with nickel and/or tin, and
creating an bond between the first conductive layer (11) and the first connector element (15) by laser welding.

13 Claims, 5 Drawing Sheets

(51) Int. Cl.
*H01G 2/02* (2006.01)
*H01G 4/40* (2006.01)
*H01G 13/00* (2013.01)

(56) References Cited

U.S. PATENT DOCUMENTS

| | | | | |
|---|---|---|---|---|
| 2004/0252501 | A1* | 12/2004 | Moriyama | F21K 9/27 |
| | | | | 362/800 |
| 2011/0177380 | A1* | 7/2011 | Langhoff | H01R 11/288 |
| | | | | 429/158 |
| 2014/0144016 | A1* | 5/2014 | Bauer | B23K 26/21 |
| | | | | 29/863 |
| 2014/0284077 | A1 | 9/2014 | Sakai et al. | |
| 2014/0355219 | A1* | 12/2014 | Tada | H05K 1/117 |
| | | | | 361/729 |
| 2016/0031042 | A1* | 2/2016 | Gietzelt | B23K 35/30 |
| | | | | 219/121.64 |
| 2016/0380120 | A1* | 12/2016 | Terao | H01L 31/0504 |
| | | | | 136/244 |
| 2018/0281110 | A1* | 10/2018 | Newman | B23K 26/21 |

FOREIGN PATENT DOCUMENTS

| | | |
|---|---|---|
| CN | 104022414 A | 9/2014 |
| CN | 104218032 A | 12/2014 |
| DE | 102016101305 A1 | 7/2017 |
| EP | 2874205 A1 | 5/2015 |
| JP | 2004265610 A * 9/2004 | ........... B23K 11/004 |
| JP | 2017168267 A | 9/2017 |

OTHER PUBLICATIONS

International Search Report and Written Opinion for International Application No. PCT/EP2019/060851, International Filing Date Apr. 29, 2019, Date of Mailing Jul. 11, 2019, 12 pages.

\* cited by examiner

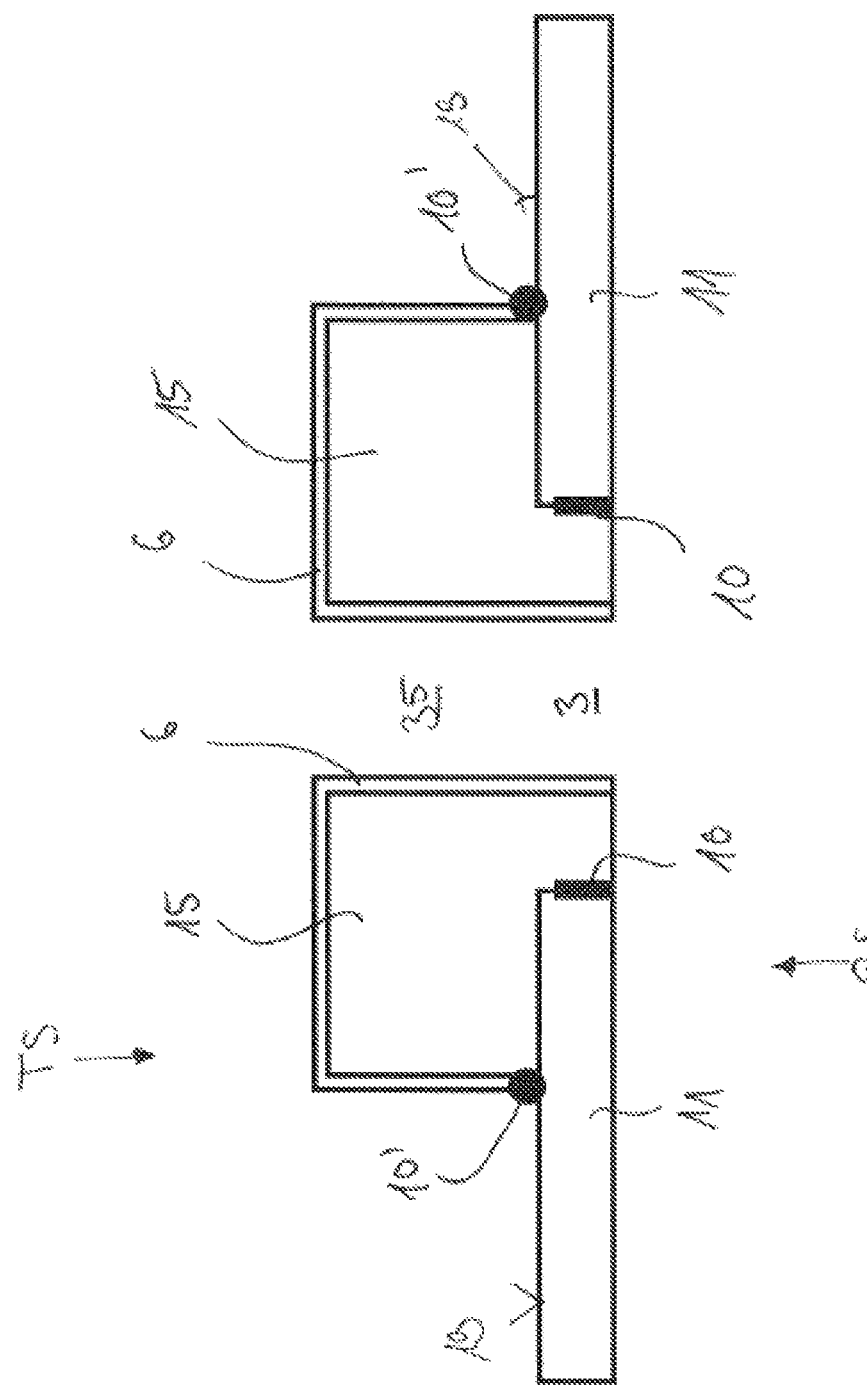

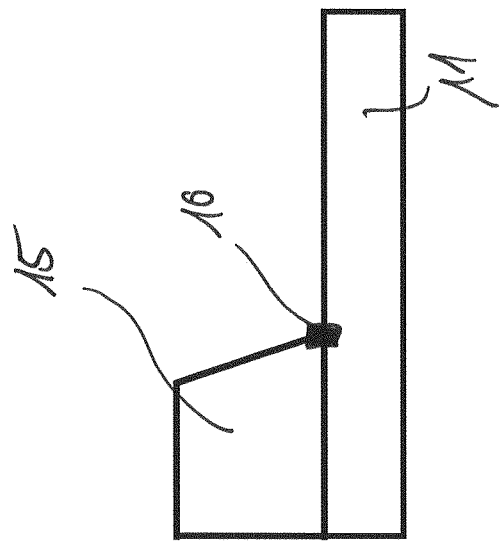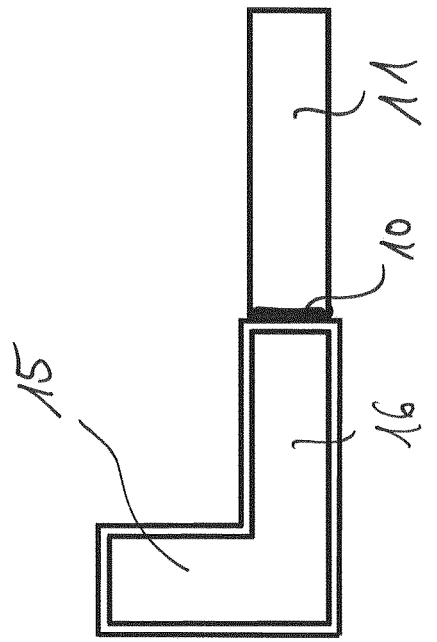
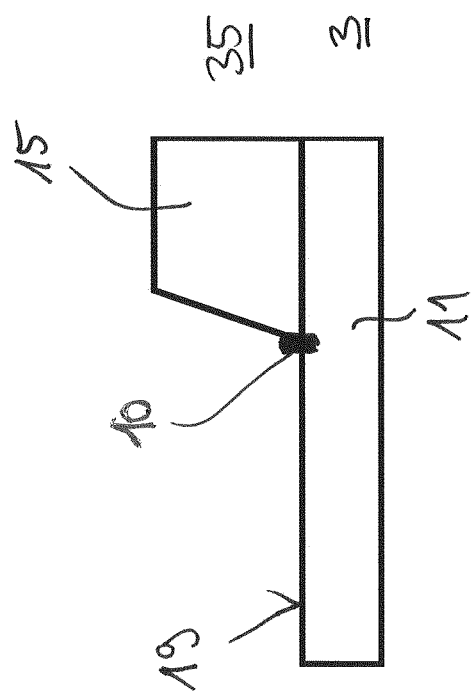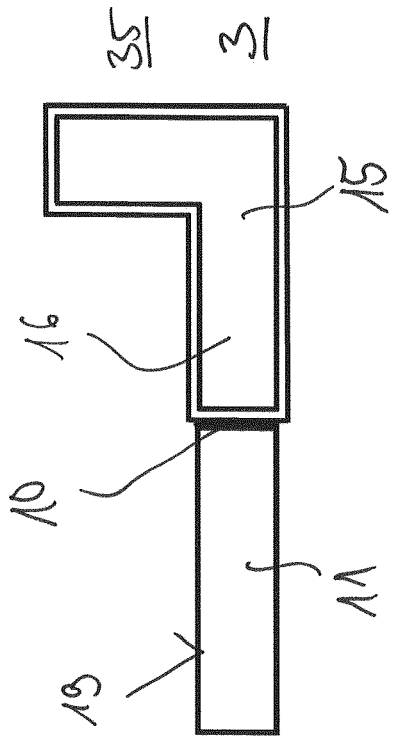
Fig. 4a
Fig. 4b

METHOD FOR MANUFACTURING A BUSBAR AND SUCH A BUSBAR

CROSS-REFERENCE TO RELATED APPLICATIONS

This application is a National Stage filing of PCT/EP2019/060851, filed Apr. 29, 2019, which claims priority to EP 18 206 250.5 filed Nov. 14, 2018, both of which are incorporated by reference in their entirety herein.

BACKGROUND

The present invention concerns a method for manufacturing a busbar, configured for mounting an electronic component, in particular a passive electronic component such as a capacitor, on the busbar, as well as such a busbar.

Laminated busbars typically comprise conductive layers of fabricated copper separated by thin dielectric materials, laminated into a unified structure. Examples for laminated busbars can be found in CN 203 504 394 U, CN 104 022 414 A1 or CN 202 474 475 U. Usually a "plug-in" region is included into the busbar, in order to connect electrical poles of an electronic component, such as a capacitor, directly to different conductive layers, wherein each of the conductive layers is assigned to a type of poles provided by each capacitor. Typically, the capacitors are connected to the plug-in region by inserting a pin into a hole of the plug-in region. Subsequently, the pins are adhesively connected to the busbar, for example by soldering, brazing and/or welding.

Further, it is known, for example from U.S. Pat. No. 5,579,217, to use conductive layers made from aluminum. Thus, a comparable light busbar can be provided. For avoiding corrosion or oxidation of these busbars, the busbar is typically covered by a nickel and/or tin cladding, in particular a nickel and/or tin plating. However, covering the whole busbar with a nickel and/o tin plating is comparable cost intensive.

SUMMARY

Considering above, it is an object of the present invention to provide a method for manufacturing a busbar and to provide a busbar that is improved compared to those known in the state of the art, in particular with respect to a cost efficiency of the manufacturing process and/or a durability of the manufactured busbar.

This object is achieved by a method for manufacturing a busbar according to claim 1 and a busbar according to claim 15. Preferred embodiments are incorporated in the dependent claims, the description, and the figures.

According to a first aspect of the present invention, a method for manufacturing a busbar is provided, in particular a laminated busbar, configured for mounting an electronic component, in particular a passive electronic component such as a capacitor, on the busbar, comprising:
  providing a first conductive layer made from aluminum,
  providing a first connector element for connecting the first conductive layer and the electronic component, wherein the first connector element is at least partially covered with nickel and/or tin and
  creating a bond, in particular an adhesive bond, between the first conductive layer and the first connector element by laser welding.

DETAILED DESCRIPTION

Figure 1:
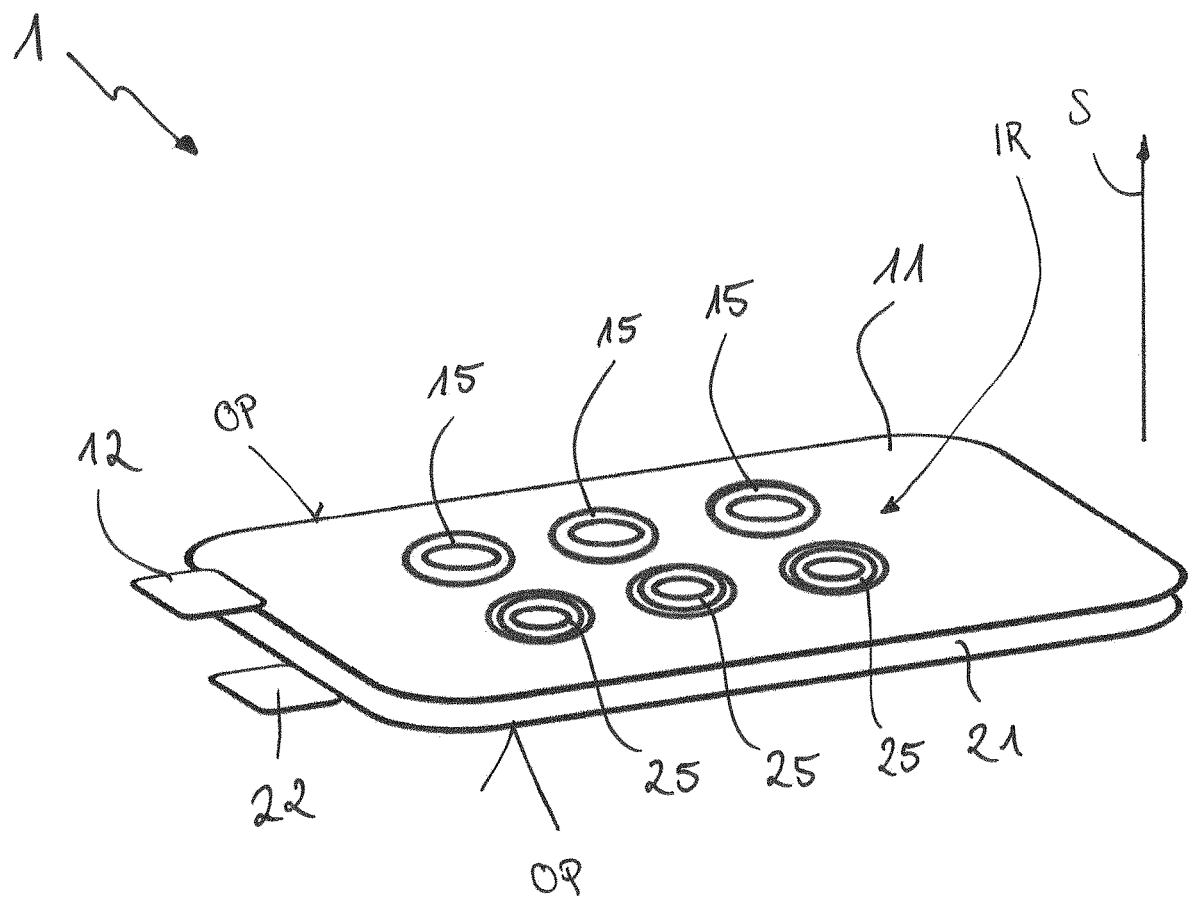
FIG. 1 schematically shows a perspective view on a busbar according to a preferred first embodiment of the present invention,
FIG. 2 schematically shows a cross-sectional view of the busbar from FIG. 1,
FIG. 3 schematically shows a first conductive layer for a busbar according to a second preferred embodiment of the present invention,
FIG. 4a schematically shows a first conductive layer for a busbar according to a third preferred embodiment of the present invention
FIG. 4b schematically shows a first conductive layer for a busbar according to a fourth preferred embodiment of the present invention and
FIG. 4c schematically shows a first conductive layer for a busbar according to a fifth preferred embodiment of the present invention.

In contrast to the state of the art, it is provided according to the present invention to connect the first connector element that is covered with nickel and/or tin and the first conductive layer by a laser welding process. It turned out that realizing the connection by laser welding establishes a durable and resistant connection between the first connector element and the first conductive layer, in particular if the first conductive layer is formed by a bare aluminum sheet and the first connector element, being covered with nickel and/or tin, is connected directly to this bare aluminum sheet. As a consequence, it is advantageously possible to realize the nickel and/or tin cover only for the connector element and avoid a covering of the first conductive layer with nickel and/or tin. In other words: the durable and resistant connection realized by the laser welding allows restricting the cover only to the first connector element and it is no longer necessary to cover the whole bus bar. Thus, material, namely nickel and/or tin, can be saved and consequently the costs can be reduced, without effecting the durability of the manufactured busbar.

Preferably, the busbar is a flat product extending in a main extension plane. The first conductive layer is preferably an aluminum sheet, especially a bare aluminum sheet that mainly defines the main extension plane. Further, it is provided that the first connector element is connected to the first conductive layer such that the first connector element protrudes from the first conductive layer along a direction being perpendicular to the main extension plane. Especially, the first connector element has a front side that faces away from the first conductive layer and forms at least a part of a connection surface to which the electronical component is connected. Preferably, a distance between the first conductive layer and said front side facing away from the first conductive layer is greater than a thickness of the first conductive layer, preferably 1.2 to 5 times, more preferably 1.5 and 4 times and most preferably 2 and 3.5 times greater than the thickness of the first conductive layer. Said distance and said thickness are measured along the direction perpendicular to the main extension plane. Preferably, the first conductive layer is covered with an isolation layer.

According to a preferred embodiment, it is provided that the method further comprises:
  providing a second conductive layer made from aluminum providing a second connector element for connecting the second conductive layer and the electronic component, wherein the second connector element is at least partially covered with nickel and/or tin, creating an bond, in particular an adhesive bond, between the second conductive layer and the second connector element by laser welding, and arranging the first conductive layer and the second conductive layer such that the second connector element reaches through the first conductive layer, in particular through a corresponding recess in the first conductive layer. For forming the bus bar, it is provided to stack the first conductive layer and the second conductive layer along a stacking direction above each other, wherein the stacking direction mainly extends perpendicular to the main extension plane. The second conductive layer, being preferably an aluminum sheet, and the first conductive layer are arranged parallel to each other and are in particular spaced from each other by another isolation layer, in particular spaced only by another isolation layer. By reaching through the first conductive layer it is advantageously possible to arrange both the first connector element and the second connector element at the same side, in particular at a top side of the busbar, wherein the top side faces to the electrical component in the mounted state. Thus, both poles of a capacitors arranged on the top side of the busbar can connect respectively the first conductive layer and the second conductive layer.

Further, it is provided that the first conductive layer and the second conductive layer are metal sheets having for example a thickness between 0.5 mm and 5 mm, preferably between 0.75 and 2 mm and more preferably between 1 and 1.5 mm, in particular measured along the stacking direction. In particular, a height of the first connector element and/or the second connector element is at least 2 to 5 times, more preferably 1.5 and 4 times and most preferably 2 and 3.5 times greater than the thickness of the first conductive layer, in particular measured along the stacking direction. In particular, realizing the nickel and/or tin cover for the first connect or element and/or the second connector element further allows to realize a low contact resistance on the first connector element, in particular on the connector surface of the first connector element. The same applies for the second connector element analogously.

In particular, it is provided that the connector element is a bushing for receiving a pin of the electrical component. Preferably, the bushing has a hole for receiving a pin of the electronical component. Thus, for mounting the electronical component the pin can inserted into the bushing, in particular in the hole.

Preferably, it is provided that the connector element is made from aluminum. Thus, the weight of the busbar can further decrease. In particular, the reduction of the weight is particularly remarkable for such busbars having bushings that realize the first connector element and the second connector element and protrudes from the top side of the busbar.

According to a preferred embodiment of the present invention it is provided that the first conductive layer and/or the second conductive layer is an aluminum sheet being at least partially free from cover made of nickel and/or tin, preferably completely free from a cover comprising nickel and/or tin. Thus, nickel and/or tin can be saved in the manufacturing process, since not the whole busbar is covered with nickel and/or tin. In particular, it is provided that the first connector element being covered with nickel and/or tin is directly adhesively bonded to a bare aluminum sheet, or at least a part of the first conductive layer and/or the second conductive layer that is formed as bare aluminum sheet. It is obviously for the skilled person that the bare aluminum sheet representing the first conductive layer can be covered with another material, for example by the isolation layer, without nickel and/or tin. In particular, the covering with the other material does not extend to a region that is adhesively bonded to the first connector element. It is also conceivable that the first conductive layer and/or the second conductive layer is partially covered with nickel and/or tin.

In another embodiment of the present invention it is provided that for bonding the first connector element to the first conductive layer, the connector element is arranged within an opening of the first conducive layer, wherein the adhesive bond is realized between the first connector element and the first conductive element at the inside of the opening. By arranging the connector element inside the opening, it is advantageously possible to increase a contact surface between the connector element and the first conductive layer. Preferably, it is provided that a laser welding seam does not extends along the whole contact surface between the connect or element and the first conductive layer. In particular, it is provided that in a finished state of the busbar a ratio of a part of the contact surface having a laser welding seam to the whole contact surface is between 0.2 and 0.8, more preferably between 0.4 and 0.7 and most preferably 0.5 and 0.6. For example, the laser welding seam extends only at the inside of the opening. It is further conceivable that the laser welding seam is realized at the inside of the opening such that laser welding seam at opposite parts of the inside of the opening are at the same height or at different heights measured in a direction parallel to the stacking direction.

Furthermore, it is provided that the first connector element is arranged in a form fitting manner in the opening and/or wherein a part of the first connector element being arranged inside the opening, reaches though the opening. By the form fitting manner, the adhesive connection between the first connector element and the first conductive layer can be further supported. In particular, it is advantageously possible to have an easy access at the bottom side for the laser, if the part of the connector element reaches through the opening. Thus, the laser welding seam can be easily realized by directing the laser beam on the bottom side of the first conductive layer.

Preferably, it is provided that the connector element is arranged on a top surface of the first conductive layer and at least partially contacts the top surface of the first conductive layer. Thus, the first connector element can be carried by the first conductive layer, advantageously. Further, the arrangement allows an increased contact surface between the first connector element and the first conductive layer, wherein said contact surface establishes an electronic contact between the first conductive layer and the first connector element.

In particular, it is provided that a nickel plating and/or a tin plating is provided to cover the first connector element and/or the second connector element, wherein the nickel plating and/or the tin plating has a thickness between 1 pm and 50 pm, preferably between 2 and 25 pm and more preferably between 5 and 15 pm. It turned out that for said thicknesses an effective corrosion and oxidation protection can be realized, without spending too much nickel and/or tin for realizing said protection.

In another embodiment of the present invention, it is provided that a further laser welding seam is generated. By adding another laser welding seam, it is possible to enhance the bonding, in particular the adhesive bonding, between the first connector element and the first conductive layer, in particular depending on the planned application of the busbar. It is also conceivable that another kind of welding is realized for enhancing the connection between the first connector element and the first conductive layer.

In particular, it is provided that a laser welding seam, in particular a signal laser welding seam, is generated by directing a laser beam on the top surface of the first conductive layer and a bottom surface of the first conductive layer or several laser welding seams are generated by directing a laser beam on the top surface of the first conductive layer and a bottom surface of the first conductive layer. Thus, it is advantageously possible to accelerate the bonding process, since the laser welding seam is generated simultaneously from both side, namely from the top side and the bottom side.

Preferably, a laser power is adjusted for defining a length of the laser welding seam and/or the further laser welding seam. Thus, it is advantageously possible to control the strength and dimensions of the generated laser welding seam or the further laser welding seam. Alternatively or additionally, it is conceivable to adjust a treatment duration, during which the laser welding seam is generated, for adapting the dimensions and/or the form of the generated laser welding seam.

In particular, the first connector element and/or the second connector element has a conical shape. Thus, inserting the second connector element inside the recess of the first conductive layer is simplified. Further, it is possible to further reduce the weight of the busbar.

Another aspect of the present invention is a busbar, in particular realized by a method according to one of the preceding claims, comprising
  a first conductive layer made from aluminum
  a first connector element for connecting the first conductive layer and the electronic component, wherein the first connector element is at least partially covered with nickel and/or tin, wherein the first conductive layer is at least partially free from a covering made of nickel and/or tin.

Figure 2:
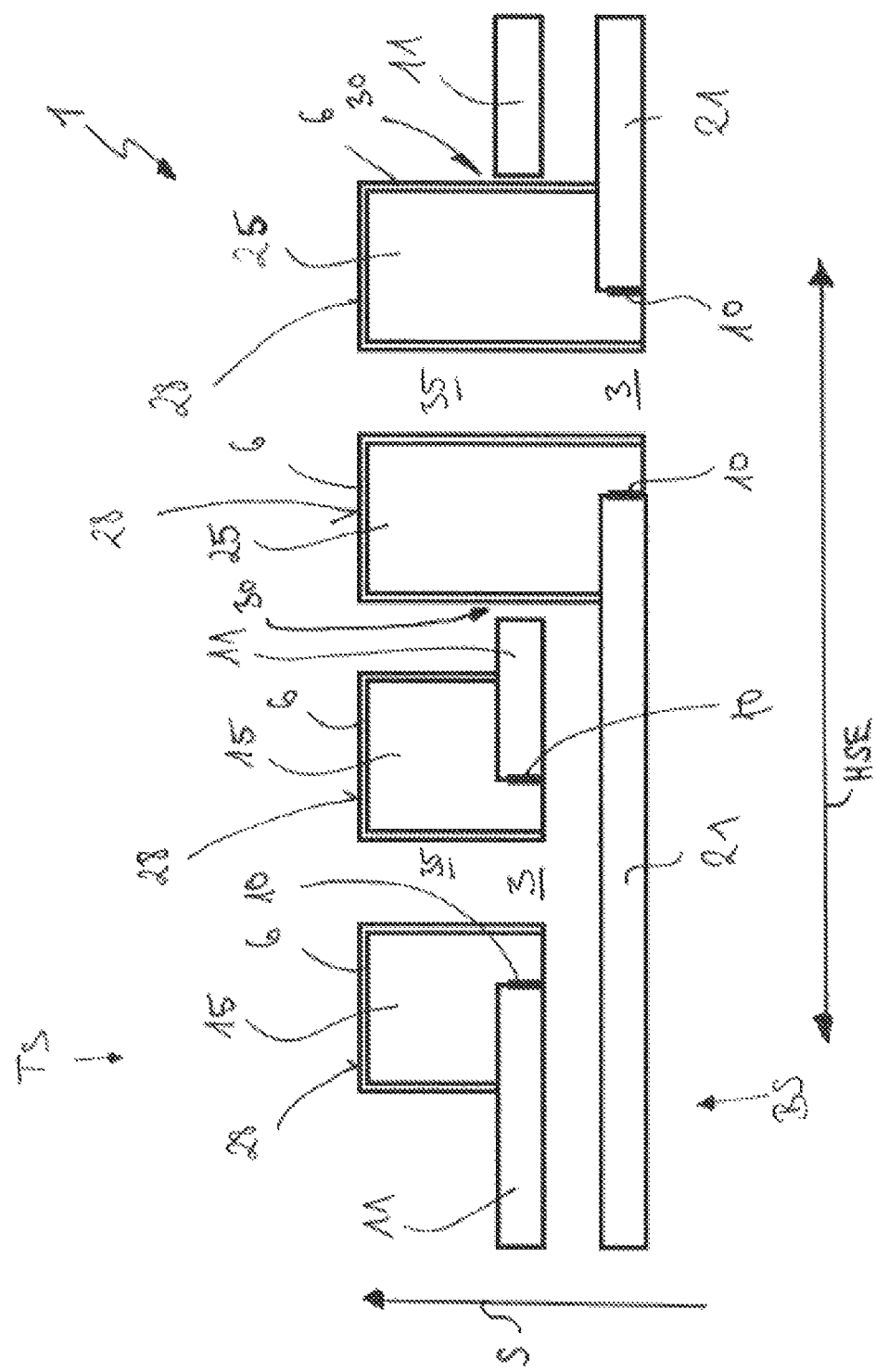

In FIGS. 1 and 2, a busbar 1 according to a first preferred embodiment of the present invention is schematically illustrated, namely in a perspective view (FIG. 1) and a cross-sectional side view (FIG. 2). Such busbars 1 are intended for collecting and distributing electrical power of an arrangement of electric components, in particular for a plurality of capacitors, which are arranged on a top side TS of the busbar 1. The busbar 1 extending in a main extending plane HSE preferably forms a carrier for the electrical components that are directly arranged on the busbar 1. Especially, the busbar 1 comprises a first conductive layer 11 extending in the main extending plane HSE and has a first contact element 12, in particular extending in a direction parallel to the main extending plane HSE from an outer periphery OP of the first conductive layer 11, for representing a common pole of the busbar 1 that collects the contributions of several first kind of poles that are each assigned to one capacitor of the several capacitors. Preferably, the first conductive layer 11 is covered by an isolation layer (not shown), which allows arranging the capacitors directly on the first conductive layer 11. Besides the first conductive layer 11, a second conductive layer 21 is provided, wherein the second conductive layer 21 extends parallel to the first conductive layer 11 and preferably the first conductive layer 11 and the second conductive layer 21 are stacked on each other along a stacking direction S. The busbar 1, in particular the first conductive layer 11 and the second conductive layer 21, form a laminated or flat product, i.e. the extension of the busbar 1 in the main extending plane HSE is several times larger than the thickness of the busbar 1 measured in a direction perpendicular to the main ex tending plane HSE. Especially, the first conductive layer 11 and the second conductive layer 21 are metal sheets having for example a thickness between 0.5 mm and 5 mm, preferably between 0.75 and 2 mm and more preferably between 1 and 1.5 mm. In particular, the material and/or the structure of the first conductive layer 11 and the second conductive layer 21 are configured such that the busbar 1, at least parts of the busbar 1, can be deformed without affecting the functionality of the first conductive layer 11 and second conductive layer 21. Thus, the busbar 1 can easily adapted to the space to which the busbar 1 or the assembly including the busbar 1 should be incorporated to, for example by bending a part of the bus bar 1. Further, the second conductive layer 21 comprises at is outer periphery OP a second contact element 22 for representing a common pole of the busbar 1 that collects the contributions of a second kind of poles that are each assigning to one pore of several capacitors.

For connecting a first kind of poles of the capacitors, for example several positive poles, to the first conductive layer 11 and for connecting a second kind of poles of the capacitors, for example several negative poles, to the second conductive layer 21, at least one first connector element 15 is provided for the first conductive layer 11 and at least one second connector element 25 for the second conductive layer 21 is provided. Preferably, the first connector element 15 protrudes from the first conductive layer 11, in particular in a direction perpendicular to the main extension plane HSE, and/or the second connector element 25 protrudes form the second conductive layer 21, in particular in a direction perpendicular to the main extension plane HSE. Furthermore, the first connector element 15 and/or the second connector element 25 are spaced from the outer periphery OP of the first conductive layer 11 and/or the second conductive layer 21 and are preferably are arranged in an inner region IR of the first conductive layer 11 and/or the second conductive layer 21, i.e. spaced from the outer periphery OP, in a direction parallel to the main extension plane HSE. Especially, the first connector element 15 and the second connector element 25 protrude in the same direction from the busbar 1. In particular, it is provided that the first conductive layer 11 and the second conductive layer 21 are arranged along a stacking direction S above each other and are spaced from each other by a further isolation layer (not shown).

Preferably, the first connector element 15 and the second connector element 25 are bushings, i.e. a cylindrical body having a hole 35 for receiving a pin of the capacitor, for contacting the capacitor to the busbar 1. Thus, the first connector element 15 and/or the second connector element 25 form and are configured to be a plug-in for the pins of the capacitors. Furthermore, it is provided that a height of the first connector element 15 and/or of the second connector element 25 measured parallel to the stacking direction S is 5 to 15 times larger than a thickness of the busbar 1. For realizing a flat busbar 1 and an adjacent arrangement of the first conductive layer 11 and the second conductive layer 21, it is provided that the first conductive layer 11 comprises recesses 30. Thus, the second connector element 25 can extend through the first conductive layer 11, in particular through the corresponding recesses 30 in the first conductive layer 11. Especially, the height of the first connector element 15 is smaller than a height of the second connector element 25. In particular, the heights of the first connector element 15 and the second connector element 25 are chosen such that front sites of the first connector element 15 and the second connector element 25, preferably of the bushings, facing away from the first conductive layer 11 and the second conductive layer 21, finish at the same distance from the first conductive layer 11. Consequently a flat connection surface 28 for connecting the capacitors to the bushings is realized, since these front sides are connected to the electrical components, for example the capacitors. FIG. 2 shows a busbar 1 having a first conductive layer 11 and a second conductive layer 21. It is obvious for the skilled person to expand the present ed idea to further conductive layers and further connector elements. Not shown in FIG. 1 and FIG. 2 is another isolation layer that is arranged between the first conductive layer 11 and the second conductive layer 21, wherein the another isolation layer guarantees the electrical isolation between the first conductive layer 11 and the second conductive layer 21.

For realizing a light busbar 1, the first conductive layer 11 and/or the second conductive layer 21 are made from aluminum. In particular, the first connector element 15 and/or the second connector element 25 are made from aluminum, too. To avoid corrosion or oxidation it is provided to cover the busbar 1 with a nickel and/or selenium plating. However, covering the whole busbar 1 with the nickel and/or selenium plating or cladding is expensive and complex to produce. Therefore, a busbar 1 is provided, wherein the first conductive layer 11 and/or the second conductive layer 21 are made from a bare aluminum sheet and only the first connector element 11 and/or the second connector element 21, in particular the bushings forming the first connector element 15 and/or the second connector element 25, are covered by the nickel and/or selenium plating/cladding. Preferably, the whole first connector element 15 and/or the second connector element 25 is cover with the nickel and/or selenium plating/cladding. Further, the nickel and/or selenium plating/cladding can protect the first connector element 15 and/or the second connector element 25 to get a low contact resistance, in particular when contacting the electronic component, for example the capacitor.

Covering only the first connector element 15 and/or the second connector element 25 with the selenium and/or nickel plating/cladding requires a special way for realizing a durable and resistant connection between the first conductive layer 11, in particular the bare aluminum sheet, and the first connector element 15 and/or between the second conductive layer 21, in particular the bare aluminum sheet, and the second connector element 25. It turned out that that such a durable and resistant connection can be realized by laser welding, since laser welding technology can directly melt the material to connect the first connector element 15 and the first conductive layer 11. In the embodiment shown in FIG. 2 it is provided that the bushings are configured such that a part of the bushing extends into an opening 3 of the first conductive layer 11. In particular, the part extending into the opening 3 is opposite to the front side forming the connection surface 28 and preferably the part is configured for interacting with the inside of the opening 3 in a form fitting manner, in particular along a direction parallel to the main extension plane HSE. Furthermore, it is provided that part of the bushing inside the opening 3 extends through the whole opening 3 along the stacking direction S. Preferably, it is provided that the adhesive connection between the first conductive layer 11 and the first connector element 15 is realized by laser welding at an inside of the opening 3. Hereby, it is preferably provided that a deepness of a laser welding seam 10 is adapted in dependency of the thickness of the first conductive layer 11 and can be realized by adjusting the laser power correspondingly. An advantage of realizing the laser welding seam 10 at the inside of the opening 3 is an easy access for the laser to realize the laser welding seam 10, in particular from a bottom side BS of the first conductive layer 11.

It further turned out that using a nickel plating shows a more stable connection between the first conductive layer 11 and the first connector element 15 and the laser welding seam 10 is more smooth by using laser available today, in particular compared to a first connector element 15 covered with selenium.

FIG. 3 schematically shows a first conductive layer 11 for a busbar 1 according to a second preferred embodiment of the present invention. The first conductive layer 11 of FIG. 3 mainly differs from the first conductive layer 11 of FIG. 2 only by an further laser welding seam 10' between the first connector element 15 and the first conductive layer 11 that is realized at the top surface 19, i.e. at the top side TS, of the first conductive layer 1 facing to the electronical component. By adding a further laser welding seam 10' it is advantageously possible to enhance a mechanical and electrical performance, in particular according to requirements of the planed application of the busbar 1.

FIG. 4a shows a first conductive layer 11 for a busbar 1 according to a third preferred embodiment of the present invention. In contrast to the embodiment shown in FIGS. 2 and 3, the first connector element 15 does not extend into the opening 3 of the first conductive layer 11. Thus, it is provided to adhesively connect the first connector element 15 and the first conductive element 11 only via the further laser beam at the top surface 19 of the first conductive layer 11. Preferably, it is provided that the bushing has a conical shape.

FIG. 4b shows a first conductive layer 11 for a busbar 1 according to a fourth preferred embodiment of the present invention. In this embodiment the bushing has a collar 16 at the front side opposite to the electrical component and the bushing inserted in the opening 3 of the first conductive layer 11 only contacts the inside of the first conductive layer 11 and not the top surface 19. In particular, it is provided that the laser welding seam 10 is realized at the outer periphery of the collar 16. Thus, it is advantageously possible to realize a laser welding seam 10 by a laser beam being direct to the top surface 19 as well as being directed to the bottom surface, i.e. at the bottom side BS, of the first conductive layer 11. Consequently, the production of the laser welding seam 10 can be accelerated.

Figure 4C:
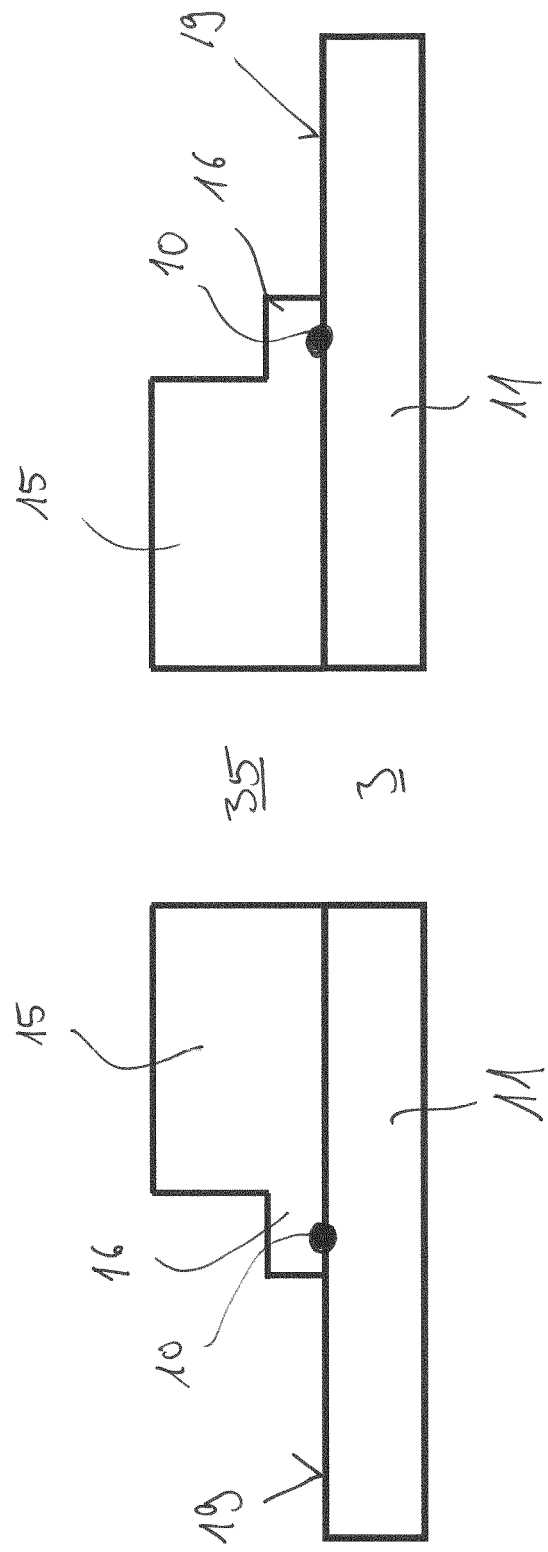

FIG. 4c shows a first conductive layer 11 for a busbar 1 according to a fifth preferred embodiment of the present invention. In this embodiment the bushing is located on the first conductive layer 11, in particular on the top surface 19, and has a collar 16 at its bottom being faced to the first conductive layer 11. Thus, a thick-ness of the bushing at the collar 16 is reduced. By irradiating the collar 16 with laser light, it is possible to realize the laser welding seam 10 between the first conductive layer 11 and the bushing, in particular between the first conductive layer 11 and the collar 16. Preferably, the extent of the collar 16 in a direction parallel to the main extending plane is HSE adapted such that the realized laser welding seam 10 in the region of the collar 16 is strong enough for the specific application.

It is obvious to the skilled person that the connection of the first connector element 15 and the first conductive layer 11 can be applied to the second connector element 25 and the second conductive layer 21, analogously.

Wherever not already described explicitly, individual embodiments or their individual aspects and features can be combined or exchanged with one another without limiting or widening the scope of the described invention, whenever such a combination or exchange is meaningful and in the sense of this invention. Advantages which are described with respect to one embodiment of the present invention are, wherever applicable, also advantageous of other embodiments of the present invention.

REFERENCE NUMBERS 1 busbar
3 opening
6 cladding
10 laser welding seam
10' further laser welding seam
11 first conductive layer
12 first contact element 15 first connector element
16 collar
19 top surface
21 second conductive layer
22 second contact element 25 second connector element
28 connection surface
30 recess
35 hole
HSE main extending plane S stacking direction
OP outer periphery
IR inner region
TS top side
BS bottom side

The invention claimed is:

1. A method for manufacturing a busbar (1), configured for mounting an electronic component on the busbar (1), the method comprising:
providing a first conductive layer (11) of the busbar made from aluminum,
providing a first connector element (15) for connecting the first conductive layer (11) and the electronic component, wherein the first connector element (15) is at least partially covered with nickel and/or tin, and
creating a bond between the first conductive layer (11) and the first connector element (15) by laser welding;
providing a second conductive layer (21) of the busbar made from aluminum,
providing a second connector element (25) for connecting the second conductive layer (21) and the electronic component, wherein the second connector element (25) is at least partially covered with nickel and/or selenium,
creating a bond between the second conductive layer (21) and the second connector element (25) by laser welding, and
arranging the first conductive layer (11) and the second conductive layer (21) such that the second connector element (25) reaches through the first conductive layer (11), in particular through a corresponding recess (30) in the first conductive layer (11).

2. The method according to claim 1, wherein the first connector element (15) and the second connector element (25) are bushings for receiving a pin of the electronic component.

3. The method according to claim 1, wherein the first conductive layer (11) and the second conductive layer (21) are aluminum sheets being at least partially free from the covering made of nickel and/or tin.

4. The method according to claim 1, wherein for bonding the first connector element (15) to the first conductive layer (11), the first connector element (15) is arranged within an opening (3) of the first conductive layer (11) and wherein the bond is realized between the first connector element (15) and the first conductive element (11) at the inside of the opening (3).

5. The method according to claim 4, wherein the first connector element (15) is arranged in a form-fitting manner in the opening (3) or wherein a part of the first connector element (15) being arranged inside the opening (3) or reaches through the opening (3).

6. The method according to claim 1, wherein the first connector element (15) is arranged on a top surface (19) of the first conductive layer (11) and at least partially contacts the top surface (19) of the first conductive layer (11).

7. The method according to claim 1, wherein a nickel plating and/or a tin plating is provided to cover the first connector element (15), wherein the nickel plating and/or the tin plating has a thickness between 1 pm and 50 pm.

8. The method according to claim 1, wherein
a laser welding seam (10), is generated by directing a laser beam on the top surface (19) of the first conductive layer (15) and by directing another laser beam on a bottom surface of the first conductive layer (15) or
several laser welding seams (10, 10') are generated by directing a laser beam on the top surface (19) of the first conductive layer (15) and by directing another laser beam on a bottom surface of the first conductive layer (15).

9. The method according to claim 1, wherein a laser power is adjusted for defining a length of the laser welding seam (10) and/or a further laser welding seam (10').

10. The method according to claim 1, wherein the first connector element (15) and/or the second connector element (25) has a conical shape.

11. A busbar made according to the method of claim 1.

12. The method of claim 1, wherein the busbar is a laminated busbar, and the electronic component is a capacitor.

13. The busbar of claim 11, wherein the busbar is a laminated busbar, and the electronic component is a capacitor.

* * * * *